United States Patent [19]
Park

[11] Patent Number: 5,926,515
[45] Date of Patent: Jul. 20, 1999

[54] PHASE LOCKED LOOP FOR IMPROVING A PHASE LOCKING TIME

[75] Inventor: Jae-Sun Park, Ahnsan-city, Rep. of Korea

[73] Assignee: SamSung Electronics Co., Ltd., Suwon, Rep. of Korea

[21] Appl. No.: 08/825,934

[22] Filed: Apr. 1, 1997

Related U.S. Application Data

[63] Continuation-in-part of application No. 08/774,195, Dec. 26, 1996, abandoned, and a continuation-in-part of application No. 08/775,107, Dec. 30, 1996, abandoned.

[30] Foreign Application Priority Data

Dec. 26, 1995 [KR] Rep. of Korea ............ 95-56544
Dec. 29, 1995 [KR] Rep. of Korea ............ 95-64216

[51] Int. Cl.$^6$ ............................................. H04L 7/00
[52] U.S. Cl. ................................. 375/376; 331/25
[58] Field of Search .......................... 375/376, 375; 331/14, 17, 25, 34; 332/128; 327/156, 159

[56] References Cited

U.S. PATENT DOCUMENTS

| | | | |
|---|---|---|---|
| 3,854,102 | 12/1974 | Seipel et al. ............ | 331/1 A |
| 3,898,690 | 8/1975 | Desai .................. | 360/51 |
| 3,903,482 | 9/1975 | Pausini et al. ........ | 331/17 |
| 4,103,250 | 7/1978 | Jacskon ................ | 331/1 A |
| 4,135,166 | 1/1979 | Marchetti ............. | 331/14 |
| 4,336,616 | 6/1982 | Carson et al. ......... | 455/202 |
| 4,613,826 | 9/1986 | Masuko et al. ........ | 331/14 |
| 4,629,999 | 12/1986 | Hatch et al. .......... | 331/1 R |
| 4,677,394 | 6/1987 | vollmer ............... | 331/1 A |
| 4,704,585 | 11/1987 | Lind .................. | 331/14 |
| 4,752,749 | 6/1988 | Moger ................. | 331/17 |
| 4,816,774 | 3/1989 | Martin ................ | 331/1 A |
| 4,864,253 | 9/1989 | Zwack ................. | 331/1 A |
| 4,942,371 | 7/1990 | Kashiwaba et al. ..... | 331/14 |
| 4,980,652 | 12/1990 | Tarusawa et al. ...... | 331/1 A |
| 5,028,885 | 7/1991 | Voigt et al. .......... | 331/1 A |
| 5,036,295 | 7/1991 | Kamitani ............. | 331/10 |
| 5,055,800 | 10/1991 | Black et al. ......... | 331/1 A |
| 5,055,801 | 10/1991 | Koga et al. .......... | 331/14 |
| 5,059,924 | 10/1991 | Jennings ............. | 331/1 A |
| 5,068,752 | 11/1991 | Tanaka et al. ........ | 360/32 |
| 5,146,187 | 9/1992 | Vandegraaf ........... | 331/17 |
| 5,170,130 | 12/1992 | Ichihara ............. | 328/155 |
| 5,184,092 | 2/1993 | Shahriary et al. ..... | 331/16 |
| 5,206,726 | 4/1993 | Okuda ................ | 358/149 |

(List continued on next page.)

FOREIGN PATENT DOCUMENTS

| | | |
|---|---|---|
| 0 041 882 | 12/1981 | European Pat. Off. . |
| 0 471 502 | 2/1992 | European Pat. Off. . |
| 070 50 579 | 2/1995 | Japan . |

*Primary Examiner*—Amanda Le
*Attorney, Agent, or Firm*—Robert E. Bushnell, Esq.

[57] ABSTRACT

A PLL for improving a locking time in a radio communication system, includes: a storage unit for digitally storing a series of different control voltages; a digital/analog converter for converting a read control voltage into an analog control voltage; a voltage controlled oscillator oscillating at a frequency in accordance with a level of a supplied analog control voltage or signal; a variable divider for frequency dividing the voltage controlled oscillator output in accordance with a variable dividing ratio determined by a system operating mode; a phase comparator for comparing a phase of the variable divider output with an externally supplied reference signal, and for outputting a phase difference signal indicative of a comparison result; a low-pass filter low-pass for filtering the phase difference signal; a level detector for comparing a level of the low-pass filter output with a reference level, and for generating a digital comparison result signal; a controller for reading one of the series of stored control voltages using the level detector output supplied to the digital/analog converter, and for performing a read operation until the level detector output is within a predetermined range; and a switch for supplying the digital/analog converter output to the voltage controlled oscillator.

25 Claims, 15 Drawing Sheets

U.S. PATENT DOCUMENTS

| | | | |
|---|---|---|---|
| 5,272,452 | 12/1993 | Adachi et al. | 331/17 |
| 5,355,098 | 10/1994 | Iwasaki | 331/14 |
| 5,367,269 | 11/1994 | Yanagidaira et al. | 331/14 |
| 5,389,899 | 2/1995 | Yahagi et al. | 331/10 |
| 5,444,420 | 8/1995 | Wernlund | 331/1 R |
| 5,477,194 | 12/1995 | Nagakura | 331/10 |
| 5,557,648 | 9/1996 | Ishihara | 375/376 |
| 5,561,400 | 10/1996 | Iguchi et al. | 331/163 |

PHASE LOCKED LOOP FOR IMPROVING A PHASE LOCKING TIME

CROSS REFERENCE TO RELATED APPLICATIONS

This application is a continuation-in-part of applications assigned Ser. No. 08/774,195 now abandoned, and Ser. No. 08/775,107, now abandoned, respectively filed in the U.S. Patent & Trademark Office on Dec. 26 and Dec. 30, 1996.

CLAIM OF PRIORITY

This application makes claims all benefits accruing under 35 U.S. C. § 119 from an application for PHASE LOCKED LOOP FOR IMPROVING A PHASE LOCKING TIME earlier filed in the Korean Industrial Property Office on Dec. 29, 1995 and there duly assigned Ser. No. 64216/1995 and from an application for PHASE LOCKED LOOP FOR A COMMUNICATION SYSTEM OF A FREQUENCY HOPPING TYPE earlier filed in the Korean Industrial Property Office on Dec. 26, 1995 and there duly assigned Ser. No. 56544/1995.

BACKGROUND OF THE INVENTION

1. Field of the Invention

The present invention relates to a phase locked loop for a communication system and, more particularly, to a phase locked loop for improving a locking time prolonged by a component deviation of a voltage controlled oscillator and deviation caused by variation of circumstances.

2. Description of the Related Art

A phase locked loop (hereinafter, referred to as a PLL) is an automatic control circuit for processing an output oscillating frequency so as to be completely synchronized with or so as to be the same frequency as the frequency of an input signal or a reference oscillator output signal. Generally, the PLL includes a phase comparator (or a phase detector), a low-pass filter and a voltage controlled oscillator, combined to form a feedback loop.

FIG. 1 illustrates the configuration of a PLL. In FIG. 1, an oscillating frequency of the voltage controlled oscillator 104 is divided by a variable divider 105 and then supplied to a phase comparator 102. The phase comparator 102 compares the phase of the divided oscillating frequency with the phase of a reference signal generated by a reference signal generator 101, and generates a phase difference signal according to a comparison result and outputs it to a low-pass filter 103. Once the signal from the phase comparator 102 is supplied to the voltage controlled oscillator 104 through the low-pass filter 103, the phase of the voltage controlled oscillator 104 varies. Consequently, the voltage controlled oscillator 104 generates a phase locked signal with the reference signal generated by the reference signal generator 101 as an output frequency fvco.

In the PLL as described above, the characteristics of the phase noise of the voltage controlled oscillator 104 and the locking time of the PLL locked with the reference signal are mainly determined by the low-pass filter 103. That is, if the bandwidth of the low-pass filter 103 is widened by adjusting the time constant, the locking time of the PLL is improved but the characteristic of the phase noise is deteriorated since the noise supplied to the voltage controlled oscillator 104 is increased. On the other hand, if the bandwidth of the low-pass filter 103 is narrowed, the characteristic of the phase noise of the voltage controlled oscillator 104 is improved but the locking time of the PLL is lowered.

Meanwhile, in a system in which a dividing value of the variable divider 105 is fixed at one and the voltage controlled oscillator 104 outputs only one oscillating frequency, the locking time of the PLL does not cause great difficulties. However, in a system for alternatively outputting the oscillating frequency of the voltage controlled oscillator 104 via variations of the variable divider 105, the locking time of the PLL must be shortened. For example, a radio telephone or a portable telephone, or a system using a frequency hopping type requires the fast locking time as well as the superior phase noise characteristic of the voltage controlled oscillator.

A method proposed according to such requirements is disclosed in U.S. Pat. No. 4,980,652 issued on Dec. 25, 1990, entitled "Frequency Synthesizer Having Compensation For Nonlinearities". The above U.S. Pat. No. 4,980,652 teaches that a control voltage value corresponding to an output frequency to be obtained in the voltage controlled oscillator is previously stored in a read only memory (hereinafter, referred to as ROM). This voltage value is then used as a control voltage of the voltage controlled oscillator. Also, an error value according to a variation of circumstances such as variations in time and temperature extracted from the low-pass filter is calculated using a drift compensation block and compensated in a subtracter block to be used as the control voltage of the voltage controlled oscillator. Thus, the above U.S. Pat. No. 4,980,652 improves the characteristics of the locking time and the phase noise by using an indirect compensation method that the voltage value previously stored in the ROM is supplied to the voltage controlled oscillator as the control voltage and the voltage value compensated from the subtracter block is supplied to the voltage controlled oscillator as the control voltage.

Meanwhile, in the voltage controlled oscillator of a 900 MHZ band of a commercially available portable telephone, an output frequency deviation caused by variations in ambient temperature is usually ±2 MHZ, and the output frequency deviation caused by the component deviation under a constant control voltage of the normal temperature is about ±5 MHZ. In other words, the output frequency deviation according to the component deviation of the voltage controlled oscillator and to the variation of circumstances such as variations in time and ambient temperature is above a few thousand PPM (parts per million). When reducing such an output frequency deviation over a few thousand PPM by using the indirect compensation method disclosed in the above U.S. Pat. No. 4,980,652, the system configuration and calculation may be complicated, and a compensation error increased.

Another method proposed for improving the characteristics of the phase noise of the voltage controlled oscillator and the locking time of the PLL is disclosed in U.S. Pat. No. 5,355,098 issued on Oct. 11, 1994, entitled "Phase-Locked Loop with Memory Storing Control Data Controlling the Oscillation Frequency". The above U.S. Pat. No. 5,355,098 teaches that the control voltage supplied to the voltage controlled oscillator immediately before the PLL is powered off is stored in a memory, and the control voltage stored in the memory is used as the control voltage of the voltage controlled oscillator when the PLL is again turned on, thereby improving the characteristics of the phase noise of the voltage controlled oscillator and the locking time of the PLL. However, even though such a method is used, if a long time has elapsed or the ambient temperature varies abruptly, the output frequency deviation according to the variation of circumstances of the voltage controlled oscillator is above a few thousand PPM. That is, since the PLL has an error range caused by a large frequency deviation during initial phase locking, the characteristic of the locking time of the PLL is deteriorated negatively. For example, after the PLL is turned off, when such a long time has elapsed that the component deviation of the voltage controlled oscillator is considerable or when moving to another place having a greatly different ambient temperature, if the power of the PLL is turned on, the output frequency deviation depending on the variation of circumstances is considerable. Accordingly, it takes a long time to lock the initial phase.

The following patents each disclose phase locked loop arrangements having features in common with the present invention. However, none of these patents teaches or suggests the specifically recited combination of features of the present invention: U.S. Pat. No. 4,103,250 to Jackson, entitled Fast Frequency Hopping Synthesizer, U.S. Pat. No. 3,903,482 to Pausini et al., entitled Arrangement For Interference Suppression In Phase Locked Loop Synchronized Oscillators, U.S. Pat. No. 4,677,394 to Vollmer, entitled Method And Apparatus For Calibrating An Adjustable Frequency Generator, U.S. Pat. No. 5,477,194 to Nagakura, entitled Temperature Compensated PLL Frequency Synthesizer And High-Speed Frequency Lock Method Using The Same, U.S. Pat. No. 5,444,420 to Werlund, entitled Numerically Controlled Phase Lock Loop Synthesizer/Modulator And Method, U.S. Pat. No. 5,367,269 to Yanagidaira et al., entitled System for Producing An Oscillating Jamming Signal Utilizing A Phase-Locked Loop, U.S. Pat. No. 5,389,899 to Yahagi et al., entitled Frequency Synthesizer Having Quick Frequency Pull In And Phase Lock-In, U.S. Pat. No. 5,184,092 to Shahriary et al., entitled Phase-Locked Loop Frequency Tracking Device Including A Direct Digital Synthesizer, U.S. Pat. No. 4,629,999 to Hatch et al., entitled Phase-Locked Loop Capable Of Generating A Plurality Of Stable Frequency Signals, U.S. Pat. No. 5,036,295 to Kamitani, entitled Frequency Synthesizer Allowing Rapid Frequency Switching, U.S. Pat. No. 4,864,253 to Zwack, entitled Phase Locked Loop Wherein Phase Comparing And Filtering Are Performed By Microprocessor, U.S. Pat. No. 4,980,652 to Tarusawa et al., entitled Frequency Synthesizer Having Compensation For Nonlinearities, U.S. Pat. No. 5,355,098 to Iwasaki, entitled Phase-Locked Loop With Memory Storing Control Data controlling The Oscillation Frequency, U.S. Pat. No. 5,561,400 to Iguchi et al., entitled Oscillator Unit, U.S. Pat. No. 3,854,102 to Seipel et al., entitled Multiple Frequency Band Frequency Synthesizer, U.S. Pat. No. 5,059,924 to JenningsCheck, entitled Clock Adapter Using A Phase Locked Loop Configured As A Frequency Multiplier With A Non-Integer Feedback Divider, U.S. Pat. No. 5,055,801 to Koga et al., entitled Digital Phase Locked Loop For Correcting A Phase Of An Output Signal With Respect To An Input Signal, U.S. Pat. No. 5,055,800 Black et al., entitled Fractional NIMSynthesis, U.S. Pat. No. 5,028,885 to Voigt et al., entitled Phase-Locked Loop Signal Generafion System With Control Maintenance, U.S. Pat. No. 4,942,371 to Kashiwaba et al., entitled Phase-Locked Loop Having Improved Input Jitter Characteristics, U.S. Pat. No. 4,816,774 to Martin, entitled Frequency Synthesizer With Spur Compensation, U.S. Pat. No. 4,135,166 to Marchetti, entitled Master Timing Generator, U.S. Pat. No. 4,336,616 to Carson et al., entitled Discriminator Aided Phase Lock Acquisition For Suppressed Carrier Signals, U.S. Pat. No. 4,752,749 to Moger, entitled Fast Response Tuner, U.S. Pat. No. 5,146,187 to Vandegraaf, entitled Synthesizer Loop Filter For Scanning Receivers, U.S. Pat. No. 5,068,752 to Tanaka et al., entitled Apparatus For Recording/Reproducing A Digital Audio Signal With A Video Signal, U.S. Pat. No. 5,170,130 to Ichihara, entitled Phase Lock Loop Circuit With A Subsidiary Loop Filter U.S. Pat. No. 5,272,452 to Adachi et al., entitled PLL Frequency Synthesizer With Variable Bandwidth Loop Filter, U.S. Pat. No. 5,557,648 to Ishihara, entitled Phase Lock Loop Circuit Using A Sample And Hold Switch Circuit and U.S. Pat. No. 3,989,690 to Desai, entitled Phase-Locked Loop For An Electronic Sectoring Schemie For Rotating Magnetic Memory.

SUMMARY OF THE INVENTON

It is an object of the invention to provide a PLL for improving a locking time prolonged by a component deviation of a voltage controlled oscillator and a deviation caused by a variation of circumstances in a radio communication system.

It is another object of the invention to provide a PLL for minimizing an error generated by a component deviation of a voltage controlled oscillator and a variation of circumstances immediately before an operation of a transmitting or receiving mode of a radio communication system is performed.

It is still another object of the invention to provide a PLL for minimizing an error caused by a component deviation of a voltage controlled oscillator and a variation of circumstances generated when a transmitting or receiving mode of a radio communication system is operated.

It is another object of the present invention to provide a PLL which is suitable for a communication system of a frequency hopping type.

It is still another object of the present invention to provide a PLL for minimizing a component deviation of a voltage controlled oscillator and a frequency deviation caused by a variation of circumstances when a transmitting/receiving operation is not performed in a communication system of a frequency hopping type.

To achieve the above objects, there is provided a PLL for improving a locking time prolonged by a component deviation of a voltage controlled oscillator and a deviation caused by a variation of circumstances by storing a control voltage for a used frequency when a transmitting/receiving operation is not performed and supplying the previously stored control voltage to the voltage controlled oscillator when the transmitting/receiving operation is performed.

A PLL for a communication system of a frequency hopping type embodying the present invention includes: a first buffer for digitally storing a series of control voltages; a second buffer connected to the first buffer; a digital/analog converter for converting a supplied digital control voltage into an analog control voltage; an adder for adding an output of the digital/analog converter to an offset voltage; a voltage controlled oscillator for oscillating at a frequency depending on the analog control voltage generated by the adder; a variable divider for frequency dividing an output of the voltage controlled oscillator according to a variable dividing ratio; a phase comparator for comparing a phase of a signal generated by the variable divider with that of a reference signal, and for generating a phase difference signal indicative of a comparison result; a low-pass filter for low-pass filtering the phase difference signal; a level detector for comparing a level of an analog signal generated by the low-pass filter with a reference level, and for generating a digital signal indicative of a comparison result; and controller for storing a corresponding control voltage related to a frequency to be used for frequency hopping in the second buffer when the digital signal is within a preset range while varying and reading the series of control voltages stored in the first buffer so as to be supplied to the digital/analog converter when a transmitting/receiving operation is not performed, and supplying the control voltage stored in the second buffer to the digital/analog converter when the transmitting/receiving operation is performed.

The PLL may use only one buffer divided into two regions instead of the first buffer for storing a series of control voltages and the second buffer for storing the control voltage related to a used frequency for frequency hopping.

The locking time of the PLL can be reduced irrespective of the component deviation and the variation of circumstances by evaluating the control voltage value corresponding to each frequency to be used for frequency hopping when the transmitting/receiving operation is not implemented and using the evaluated control voltage value during the transmitting/receiving operation.

To achieve these and other objects, the present invention can be accomplished with a PLL for improving a phase locking time which evaluates the control voltage for frequencies needed in each operation immediately before the operations of the receiving and transmitting mode are performed and uses the evaluated control voltage in a real operation mode, so that the locking time prolonged due to the deviation of circumstances and the component deviation of a radio communication system can be improved positively.

In accordance with one aspect of the present invention, a phase locked loop of a radio communication system includes: a storage for digitally storing a series of control voltages having different values; a digital/analog converter for converting a read control voltage into an analog control voltage when any one of the series of control voltages stored in the storage is read; a voltage controlled oscillator for oscillating at a frequency in accordance with a level of a supplied analog control voltage or an analog signal; a variable divider for frequency dividing an output of the voltage controlled oscillator according to a variable dividing ratio determined by an operating mode of the radio communication system; a phase comparator for comparing a phase of a signal outputted from the variable divider with that of an externally supplied reference signal, and outputting a phase difference signal indicative of a comparison result; a low-pass filter for low-pass filtering the phase difference signal; a level detector for comparing a level of an analog signal outputted from the low-pass filtering unit with a reference level, and for generating a comparison result as a digital signal; a controller for reading any one of the series of control voltages stored in the storage by using the digital signal outputted from the level detector which is supplied to the digital/analog converter, and for performing a read operation until the digital signal outputted from the level detector is within a predetermined range; and a switch for supplying the analog control voltage outputted from the digital/analog converter to the voltage controlled oscillator by being electrically turned off under the control of the controller immediately before an operating mode of the radio communication system is implemented, and for supplying the analog signal outputted from the low-pass filter to the voltage controlled oscillator by being electrically turned on under the control of the controller when the radio communication system is in operation.

The controller performs the read operation for the series of control voltages stored in the storage unit by electrically turning off the switch when a power of the phase locked loop is turned on or a receiving signal or a key input for signal transmission is sensed. The read operation is performed by increasing a control voltage value stored in the storage unit when a level of the digital signal generated by the level detector is less than the predetermined range, and by decreasing the is control voltage value stored in the storage unit when a level of the digital signal generated by the level detector is greater than the predetermined range. Even if there is no operation for a preset time during an operating mode of the radio communication system, the controller reads any one of the series of control voltages stored in the storage unit by using the digital signal generated by the level detector which is supplied to the digital/analog converter, and performs the read operation until the digital signal generated by the level detector is within a predetermined range.

In accordance with another aspect of the present invention, a phase locked loop of a radio communication system includes: a storage unit for digitally storing a series of control voltages having different values; a digital/analog converter for converting a read control voltage into an analog control voltage when any one of the series of control voltages stored in the storage unit is read; a voltage controlled oscillator for oscillating at a frequency in accordance with a level of a supplied analog control voltage or an analog signal; a variable divider for frequency dividing an output of the voltage controlled oscillator according to a variable dividing ratio determined by an operating mode of the radio communication system; a phase comparator for comparing a phase of a signal outputted from the variable dividing unit with that of an externally supplied reference signal, and for outputting a phase difference signal indicative of a comparison result; a low-pass filter for low-pass filtering the phase difference signal; an analog/digital converter for converting the analog signal outputted from the low-pass filter into a digital signal; a controller for reading any one of the series of control voltages stored in the storage unit by using the digital signal outputted from the level detector which is supplied to the digital/analog converter, and performing a read operation until the digital signal outputted from the level detector is within a predetermined range; and a switch for supplying the analog control voltage outputted from the digital/analog converter to the voltage controlled oscillator by being electrically turned off under the control of the controller immediately before an operating mode of the radio communication system is implemented, and for supplying the analog signal outputted from the low-pass filter to the voltage controlled oscillator by being electrically turned on under the control of the controller when the radio communication system is in operation.

The controller performs the read operation for the series of control voltages stored in the storage unit by electrically turning off the switch when a power of the phase locked loop is turned on or a receiving signal or a key input for signal transmission is sensed. The read operation is performed by increasing a control voltage value stored in the storage unit when a level of the digital signal generated by the analog/digital converter is less than the predetermined range, and by decreasing the control voltage value stored in the storage unit when a level of the digital signal generated by the analog/digital converter is greater than the predetermined range. Even if there is no operation for a preset time during an operating mode of the radio communication system, the controller reads any one of the series of control voltages stored in the storage unit by using the digital signal generated by the analog/digital converter which is supplied to the digital/analog converter, and performs the read operation until the digital signal generated by the analog/digital converter is within a predetermined range.

In accordance with still another aspect of the present invention, a phase locked loop of a radio communication system includes: a storage unit for digitally storing a series of control voltages having different values; a digital/analog converter for converting a read control voltage into an analog control voltage when any one of the series of control voltages stored in the storage unit is read; a voltage controlled oscillator for oscillating at a frequency in accordance with a level of a supplied analog control voltage or an analog signal; a variable divider for frequency dividing an output of the voltage controlled oscillator according to a variable dividing ratio determined by an operating mode of the radio communication system; a phase comparator for comparing a phase of a signal outputted from the variable divider with that of an externally supplied reference signal, and outputting a phase difference signal indicative of a comparison result; a low-pass filter for low-pass filtering the phase difference signal; a phase error comparator for detecting a phase error value between a signal outputted from the variable divider and the reference signal by using the phase difference signal; a controller for reading any one of the series of control voltages stored in the storage unit by using the digital signal outputted from the level detector which is supplied to the digital/analog converter, and performing a read operation until the digital signal outputted by the level detector is within a predetermined range; and a switch for supplying the analog control voltage outputted from the digital/analog converter to the voltage controlled oscillator by being electrically turned off under the control of the controller immediately before an operating mode of the radio communication system is implemented, and for supplying the analog signal outputted by the low-pass filter to the voltage controlled oscillator by being electrically turned on under the control of the controller when the radio communication system is in operation.

The controller performs the read operation for the series of control voltages stored in the storage unit by electrically turning off the switch when a power of the phase locked loop is turned on or a receiving signal or a key input for signal transmission is sensed. The read operation is performed by increasing a control voltage value stored in the storage unit when the phase error value generated by the phase error comparator is less than the predetermined range, and by decreasing the control voltage value stored in the storage unit when the phase error value generated by the phase error comparator is greater than the predetermined range. Even if there is no operation for a preset time during an operating mode of the radio communication system, the controller reads any one of the series of control voltages stored in the storage unit by using the phase error value generated by the phase error comparator which is supplied to the digital/analog converter, and performs the read operation until the phase error value generated by the phase error comparator is within a predetermined range.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE PREFERRED EMBODIMENT

Figure 1:
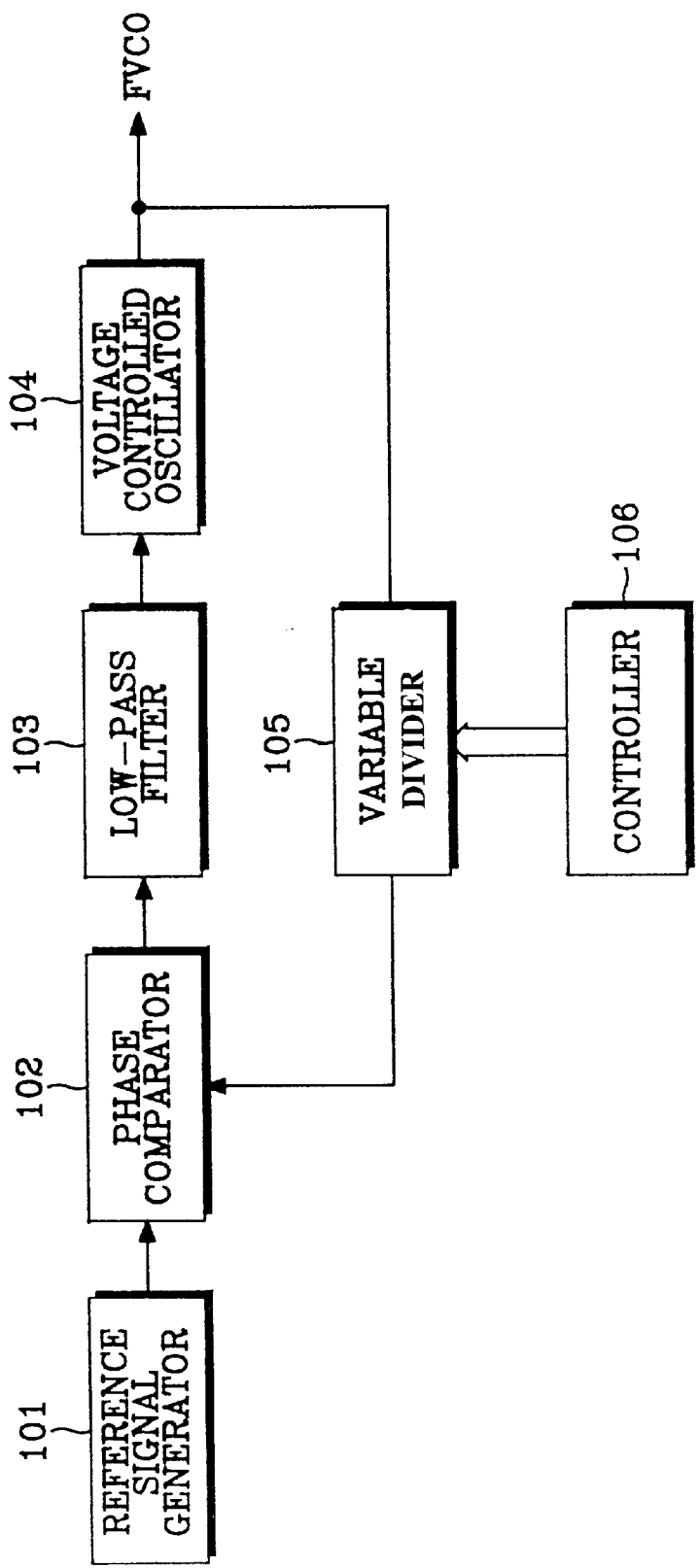
FIG. 1 is a block diagram showing the configuration of a PLL.

Throughout the drawings, it is noted that the same reference numerals letters will be used to designate like or equivalent elements having the same function. Further, in the following description, numerous specific details such as concrete components composing the circuit and the frequencies used, are set forth to provide a more thorough understanding of the present invention. It will be a apparent, however, to one skilled in the art that the present invention may be practiced without these specific details. A detailed description on known functions and constructions unnecessarily obscuring the subject matter of the present invention has been avoided in the present application.

Figure 2:
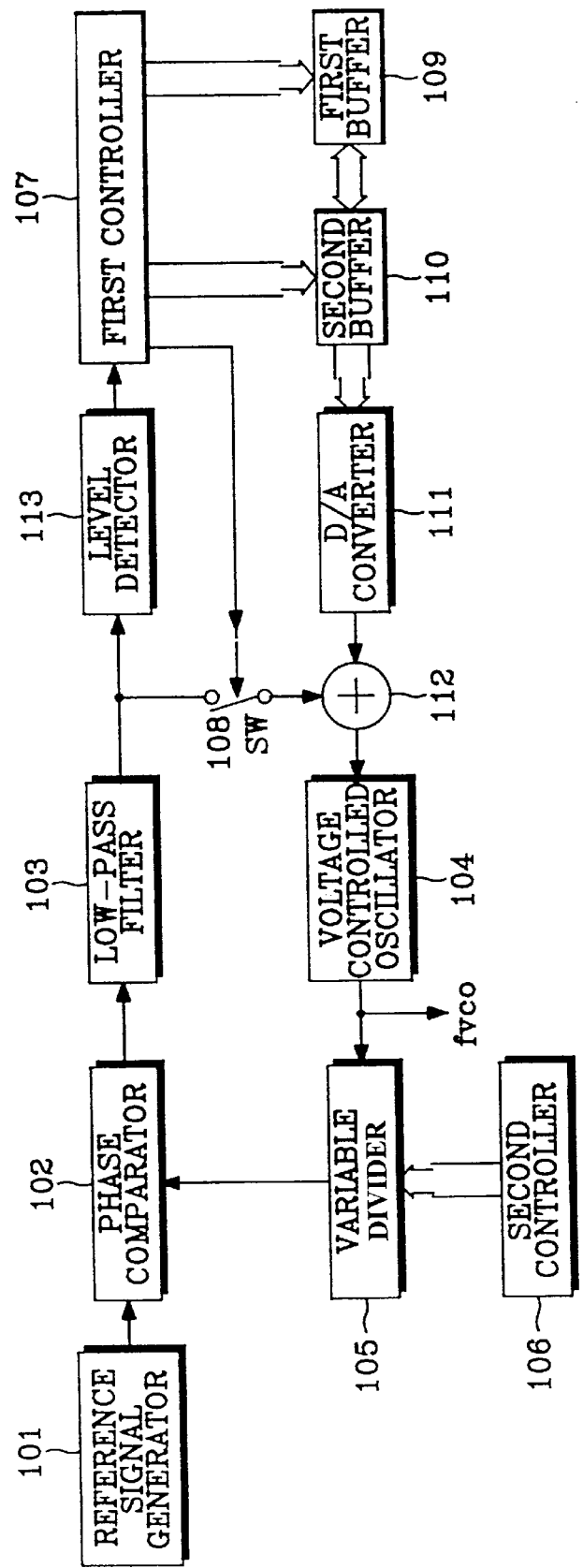
FIG. 2 is a block diagram showing the configuration of a PLL according to a first embodiment of the present invention.

Referring to FIG. 2, a switch 108 is turned off immediately before communication is performed. If digital data stored in a second buffer 110 which is an auxiliary storage device is converted into analog data by a digital/analog (D/A) converter 111 and supplied to a voltage controlled oscillator 104 through an adder 112, then the voltage controlled oscillator 104 continues to output a specific oscillating frequency. Here, the stability of an output frequency of the voltage controlled oscillator 104 depends on its short-term stability characteristic. The short-term stability characteristic of the commercially available voltage controlled oscillator of a 900 MHZ band reaches a few hundred PPM from a few ten PPM.

A phase comparator 102 compares an output of a variable divider 105 which frequency divides the oscillating frequency of the voltage controlled oscillator 104 according to a variable dividing ratio determined by a second controller 106 with the phase of a reference signal generated by a reference signal generator 101, and generates a phase difference signal indicative of a comparison result. Since the phase difference signal includes many high frequency and noise components, a low-pass filter 103 converts the high frequency and noise components into a direct current (DC) component and supplies the DC component to the switch 108 and a level detector 113. At this time, a signal generated by the low-pass filter 103 is an analog signal. The level detector 113 detects whether or not the phase difference signal is within a specific range by comparing the analog signal generated by the low-pass filter 103 with a predetermined reference level value, and supplies the detection result as a digital signal to a first controller 107. The first controller 107 checks whether or not the phase difference signal is within the specific range and checks which is the faster of two phases of the reference signal and the oscillating signal of the voltage controlled oscillator 104 by using the digital signal generated by the level detector 113. Further, the first controller 107 causes the phase difference between the reference signal and the oscillating signal of the voltage controlled oscillator 104 to be within the specific error range by increasing or decreasing the data stored in the second buffer 110 according to the judged result. If the phase difference between the reference signal and the oscillating signal of the voltage controlled oscillator 104 is within the specific error range, the first controller 107 stores corresponding data of the second buffer 110 in a first buffer 109. Since the first buffer 109 consists of a plurality of addresses corresponding to each frequency used in the system, data selected by the first controller 107 among the data of the second buffer 110 can be stored in a corresponding address of the first buffer 109.

If the communication is started, the data stored in the first buffer 109 is converted into analog data by the D/A converter 111 and supplied to the voltage controlled oscillator 104 as the control voltage. If the data converted by the D/A converter 111 is supplied to the voltage controlled oscillator 104 through the adder 112, the first controller 107 turns on the switch 108 so that the deviation generated by the short-term stability characteristic of the voltage controlled oscillator 104 and the deviation generated by the variation of circumstances such as time and space may be continuously compensated.

Figure 3:
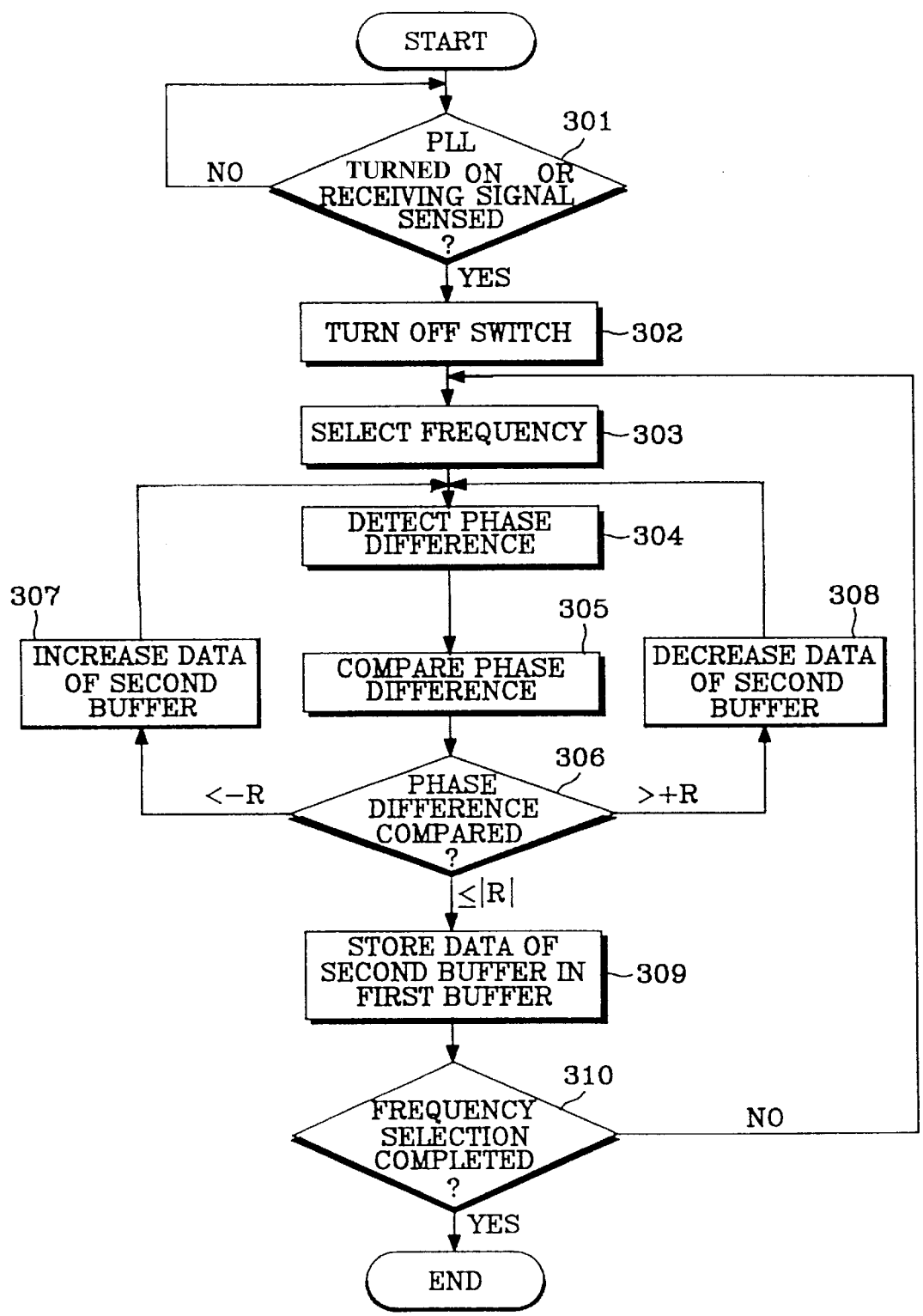
FIG. 3 is a flowchart showing the write operation performed in a receiving mode of the PLL according to the present invention.

FIG. 3 is a flowchart showing a write operation performed in a receiving mode of the PLL. The write operation is started when the PLL is turned on or when a receiving signal is sensed.

If the PLL is turned on or the receiving signal is sensed (at step 301), the first controller 107 turns off the switch 108 (at step 302). Next, divider data corresponding to a frequency selected by the second controller 106 is sent to the variable divider 105, and the first controller 107 writes the data of the first buffer 109 as a main storage device in the second buffer 110 or writes arbitrary data in the second buffer 110. That is, a frequency selecting process is implemented (at step 303). After the phase difference between the reference signal and the oscillating signal of the voltage controlled oscillator 104 is detected (at step 304), it is checked whether or not the phase difference is within a permissible error range ±R (at step 305 and step 306). If the phase difference is greater than the permissible error range +R, the first controller 107 decreases the data value of the second buffer 110 (at step 308) and again detects the phase difference (at step 304). However, if the phase difference is less than the permissible error range −R, the first controller 107 increases the data value of the second buffer 110 (at step 307) and again detects the phase difference (at step 304). If the phase difference is within the permissible error range ±R, the first controller 107 writes the data of the second buffer 110 as the auxiliary storage device in the first buffer 109 as 110 as the main storage device (at step 309). Whether or not the above processes for the used frequency are implemented is checked (at step 310). If not, the first controller 109 returns to the frequency selecting process (at step 303) to write the data of the second buffer 110 in the first buffer 109. If the above processes are all implemented, the process for writing the data of the second buffer 110 in the first buffer 109 is completed. Thus, the operation of the receiving mode is ended.

Figure 4:
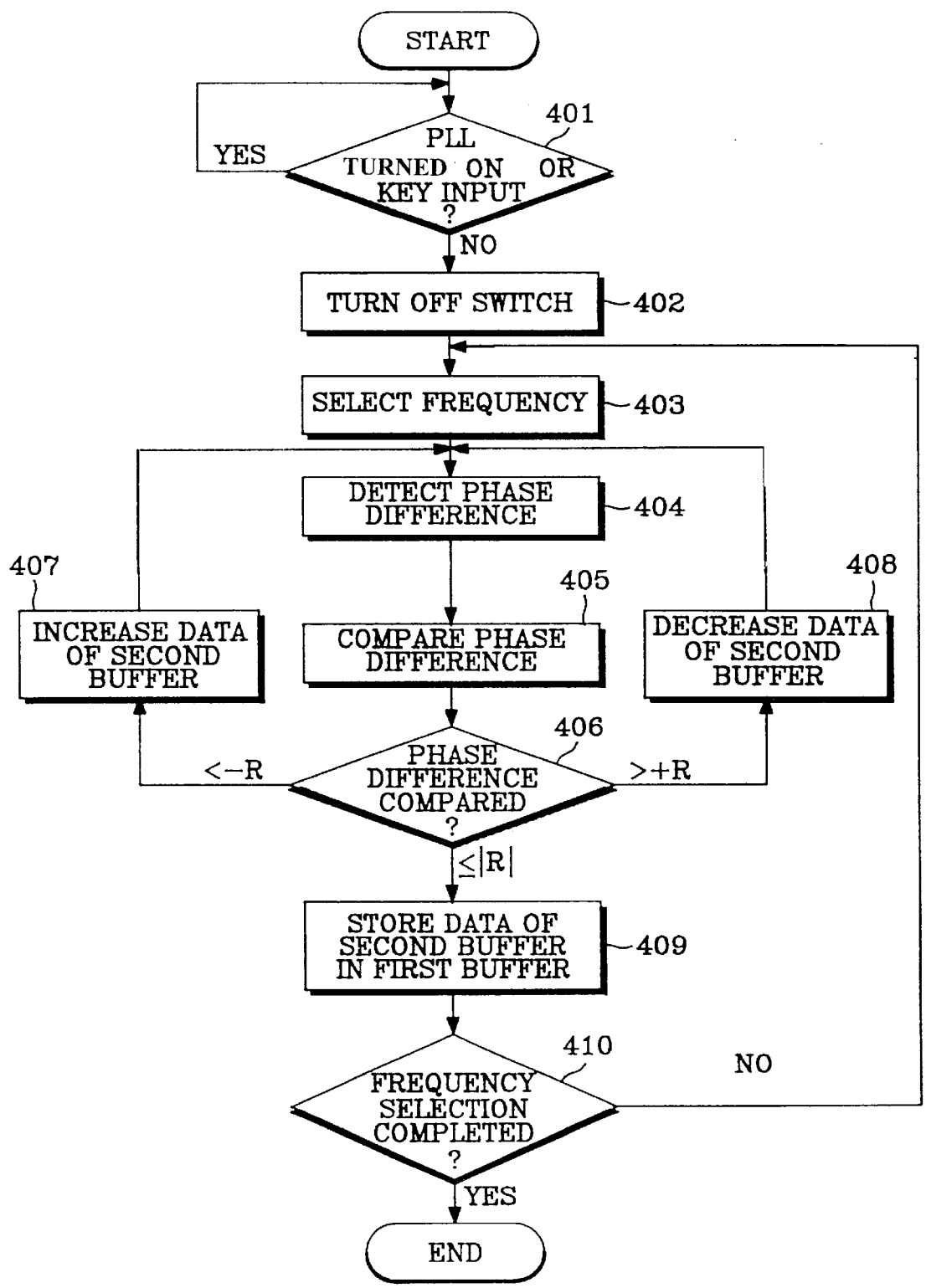
FIG. 4 is a flowchart showing the write operation performed in a transmitting mode of the PLL according to the present invention.

FIG. 4 is a flowchart showing the write operation performed in a transmitting mode of the PLL.

The write operation of the transmitting mode shown in FIG. 4 is the same as that of the receiving mode shown in FIG. 3 except that the operation of the transmitting mode is started (at step 401) when the PLL is turned on or when it is desired that the user transmits data, for example, when the user presses a keypad of a telephone. In a telephone, whether or not data is generated by the keypad of the telephone is checked with a period of about 50 ms. In systems other than the telephone, the operation of the transmitting mode is started by sensing whether or not the user generates data.

As shown in FIGS. 3 and 4, since the PLL according to the present invention uses the control voltage of the voltage controlled oscillator corresponding to the frequency needed in each mode immediately before the actual transmitting and receiving operation is performed in a communication mode (the transmitting mode and the receiving mode) of the system, the PLL can be locked within a fast time. That is, the locking time of the PLL can be shortened by using an appropriate value without considering the difference of the data generated by the deviation of the voltage controlled oscillator or other components and the deviation caused by the variation of the circumstances. Further, there is a function for compensating for the locking time of the PLL prolonged according to increment in an error of the data stored in the first buffer 109 due to the variation of circumstances such as the abrupt variation of space during the operation of the communication mode. For such a function, a flowchart showing the write operation performed in the communication mode of the PLL is indicated in FIG. 5.

In the operation of each mode of the transmitting and receiving modes of the radio communication system, the data is not always continuously and quickly transmitted and received. At any moment, the data may be slowly transmitted and received. The first controller 107 continues to sense a slow state of the transmitting and receiving operation, that is, the first controller 107 checks whether or not the transmitting and receiving state is idle (at step 501). If the transmitting and receiving state is idle, the first controller 107 maintains the switch 108 in an on state (at step 502). The phase difference between the reference signal and the oscillating signal of the voltage controlled oscillator 104 is detected (at step 503). The first controller 107 compares the phase difference with the permissible error range (at step 504). According to the comparison result, the data of the second buffer 110 is decreased (at step 506) or increased (at step 505). If the phase difference is within the permissible error range, the first controller 107 updates the data in the first buffer 109 (at step 507). The first controller 107 corrects the data stored in the first buffer 109 with respect to other used frequencies by comparing the updated data with the previous data and updates the corrected data (at step 508). The first controller 107 periodically checks whether or not the transmitting and receiving state is idle (at step 509) and continues to update the data stored in the first buffer 109. Meanwhile, since an error value generated by one frequency is similarly applicable to other frequencies having different error values, the updated value by the variation of circumstance may be supplied to other frequencies.

Figure 5:
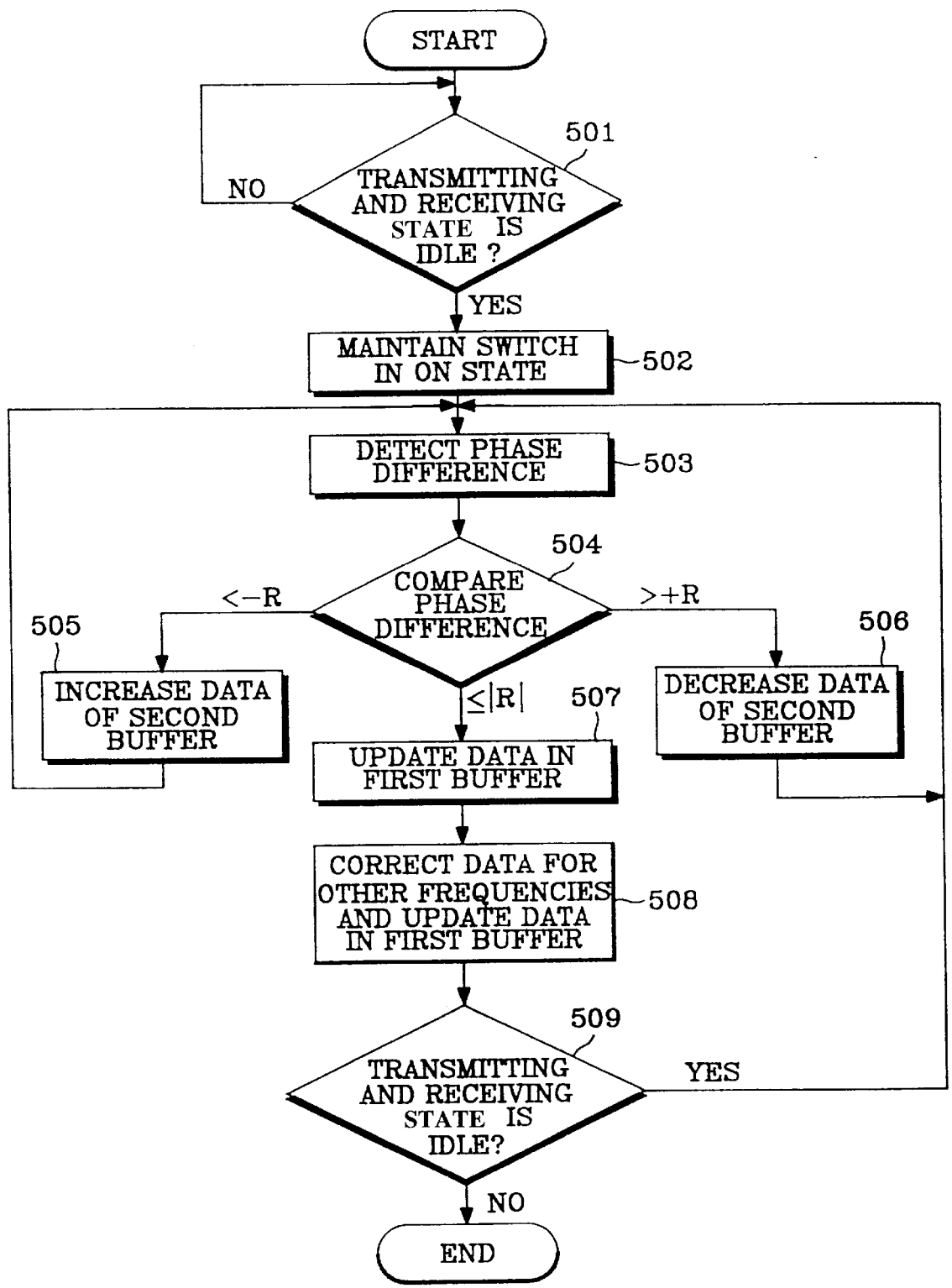
FIG. 5 is a flowchart showing the write operation performed in the receiving or transmitting mode of the PLL according to the present invention.
Figure 6:
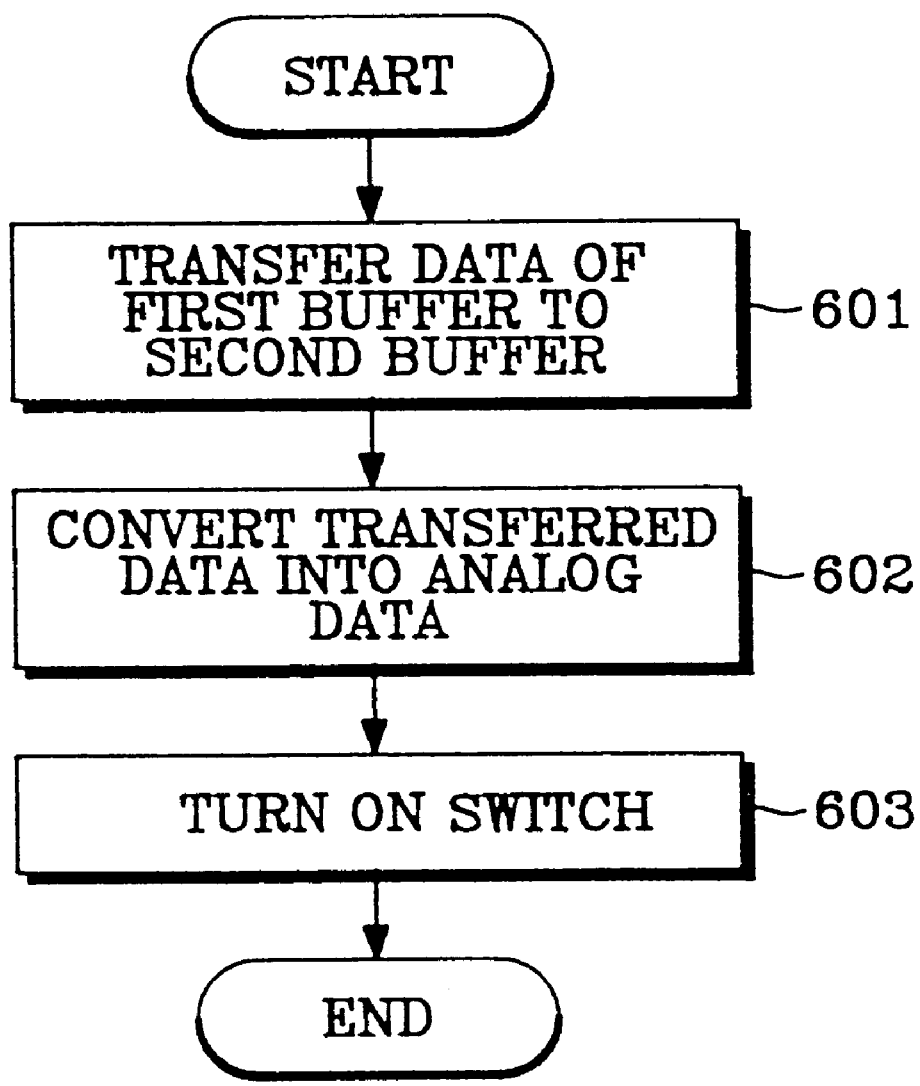
FIG. 6 is a flowchart showing the read operation performed in the receiving mode of the PLL according to the present invention.

FIG. 6 is a flowchart showing a read operation performed in the PLL, and illustrates a process for reading data stored or updated through the above processes shown in FIGS. 3 to 5.

The first controller 107 transfers the data stored in the first buffer 109 to the second buffer 110 (at step 601). The data is converted into the analog data through the D/A converter 111 (at step 602). The converted data is supplied to the voltage controlled oscillator 104 through the adder 112. The switch 108 is turned on (at step 603) when the frequency of the voltage controlled oscillator 104 is within the permissible error range by a signal converted through the D/A converter 111. Therefore, the PLL is locked within the faster time.

Since the PLL according to present invention stores the appropriate data value within the permissible error range in the first buffer 109 through the above described processes indicated in FIGS. 3 to 6, the PLL can be quickly locked under any circumstances.

Figure 7A:
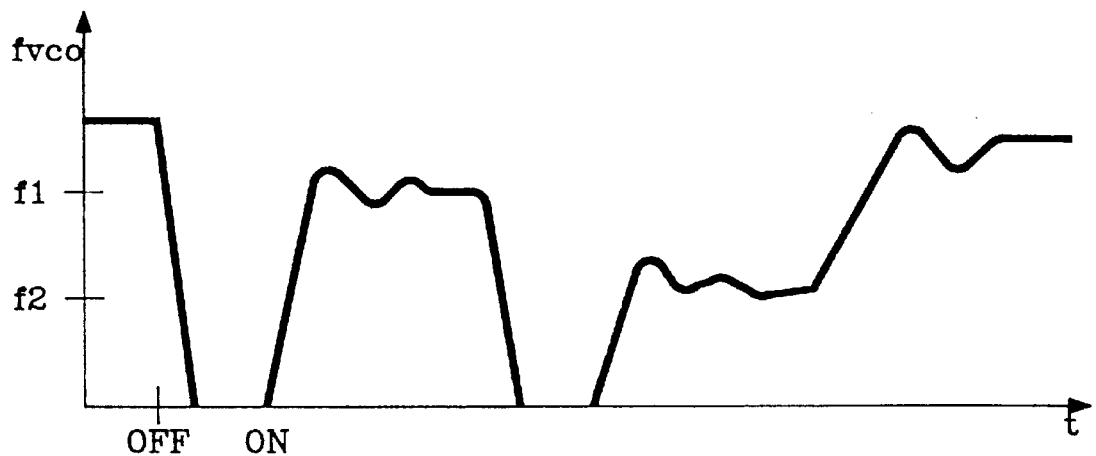
FIG. 7A is a graph showing the locking time characteristic of an earlier PLL.
Figure 7B:
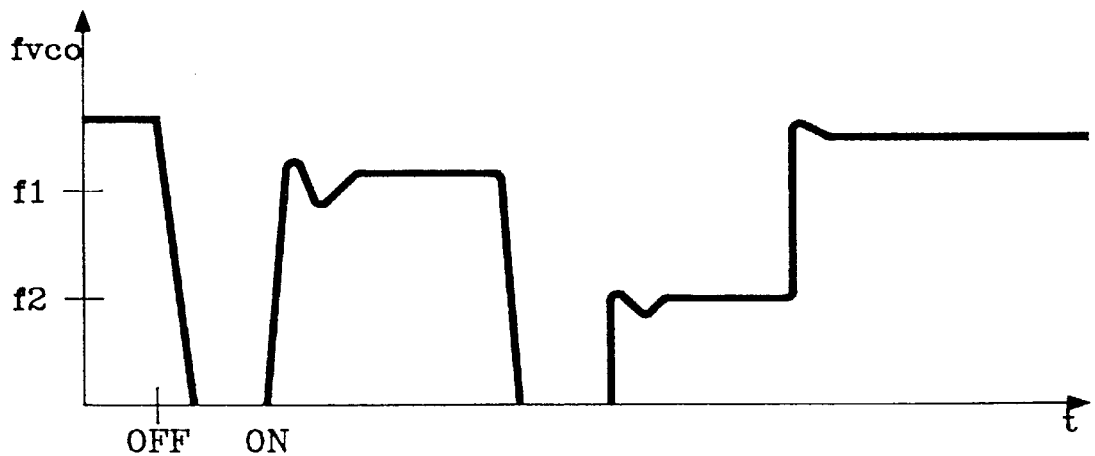
FIG. 7B is a graph showing the locking time characteristic of the PLL according to the present invention.

FIG. 7A shows a locking time characteristic of an earlier PLL. FIG. 7B shows the locking time characteristic of the PLL according to the present invention. Referring to FIG. 7A, if the power is again turned on after it is turned off, the locking time of the PLL is prolonged by the characteristic of the PLL including the low-pass filter 103. Moreover, when changing the frequency during use, the locking time is considerably prolonged. Referring to FIG. 7B, even if the power is turned on or the frequency is changed, the locking time is fast.

Figure 8:
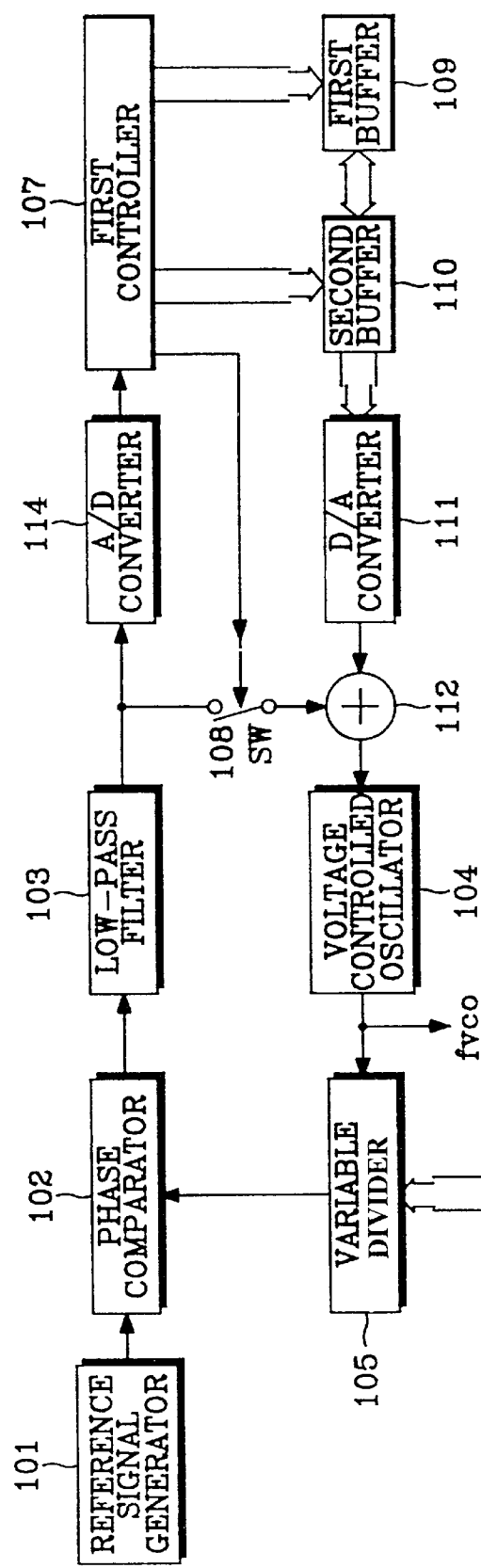
FIG. 8 is a block diagram showing the configuration of a PLL according to a second embodiment of the present invention.
Figure 9:
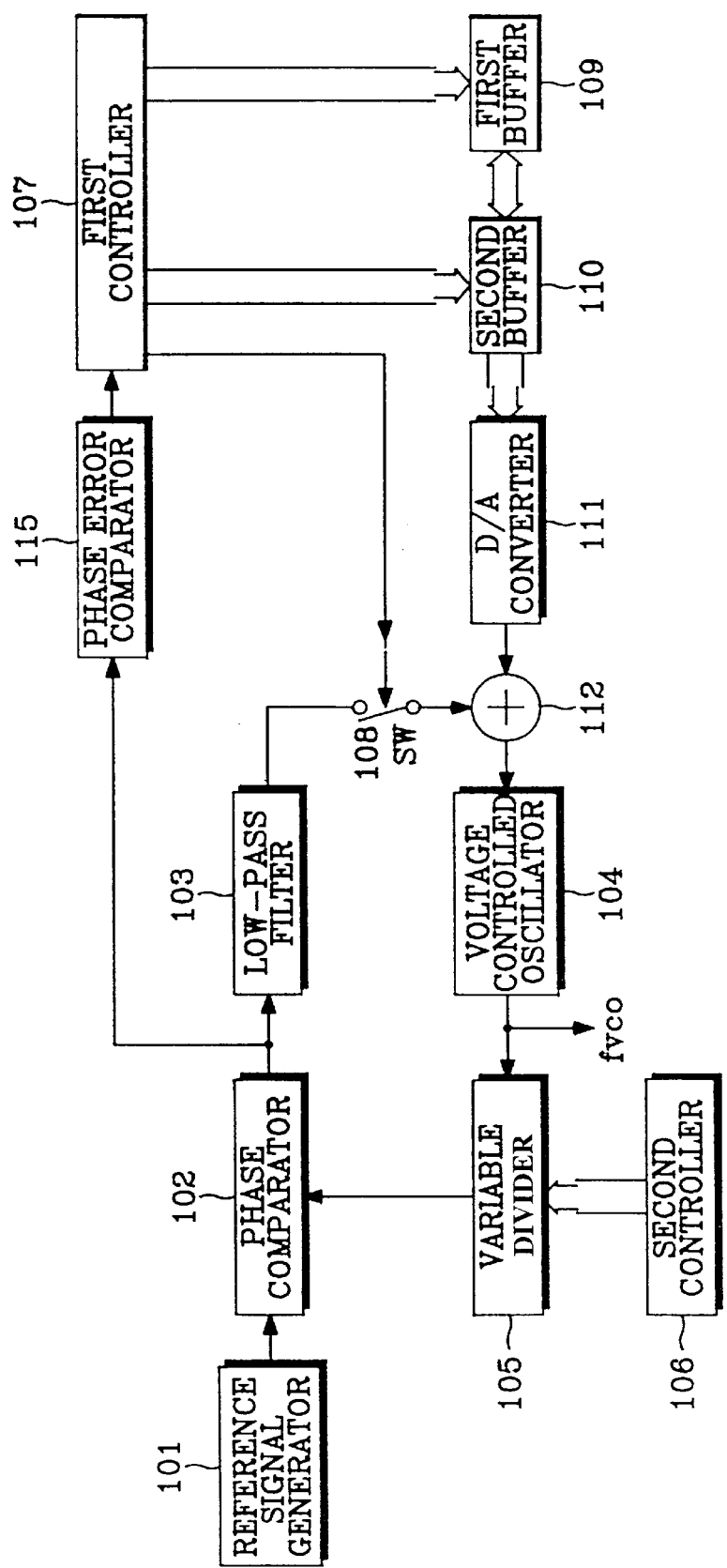
FIG. 9 is a block diagram showing the configuration of a PLL according to a third embodiment of the present invention.

FIGS. 8 and 9 respectively show the configuration of the PLL according to second and third embodiments of the present invention.

The PLL shown in FIG. 8 is the same as that shown in FIG. 2 except that a signal corresponding to the phase difference between the reference signal generated by the reference signal generator 101 and the oscillating signal of the voltage controlled oscillator 104 is supplied to the first controller 107 through an A/D converter 114 rather than through the level detector 113. The first controller 107 analyzes whether or not the phase difference signal is within the specific error range by using an output signal generated by the A/D converter 114 and controls the first and second buffers 109 and 110.

The PLL shown in FIG. 9 is the same as that shown in FIG. 2 except that the phase difference signal generated by the phase comparator 102 is supplied to the first controller 107 not through the low-pass filter 103 but through a phase error comparator 115. The first controller 107 analyzes whether or not the phase difference signal is within the specific error range by using an output signal generated by the phase error comparator 115 and controls the first and second buffers 109 and 110.

As noted previously, since the PLL can be locked within a short period of time under any circumstances, it is very useful in the communication system requiring a fast variation of frequency, for example, the communication system of a frequency hopping type.

Figure 10:
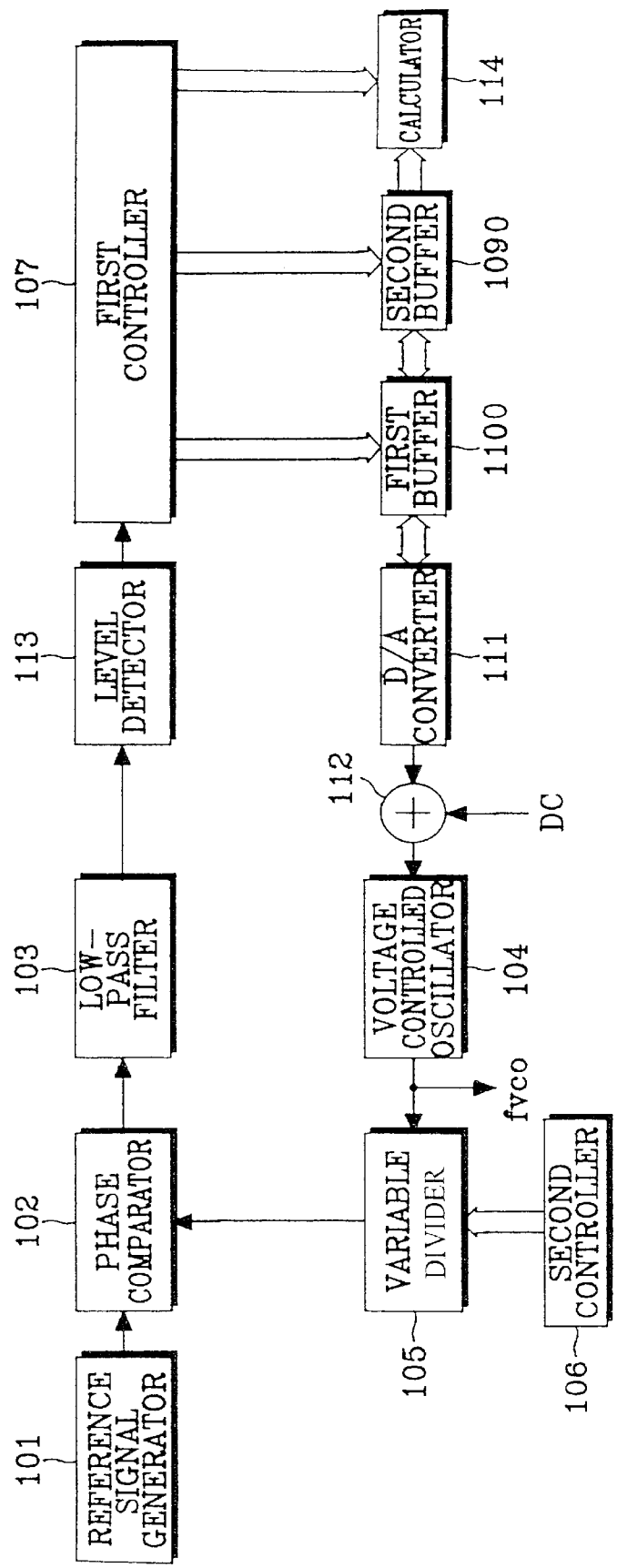
FIG. 10 is a block diagram showing the configuration of another PLL according to the present invention.

FIG. 10 is a block diagram showing the configuration of a PLL according to another embodiment of the present invention.

Referring to FIG. 10, there is no switch 108 included in the PLL as depicted in FIG. 2. For a switch 108 as shown in FIG. 2 is omitted to be applied to the communication system of the frequency hopping type.

When the transmitting/receiving operation is not performed, if digital data stored in a first buffer 110 is converted into analog data by a digital/analog (D/A) converter 111 and supplied to a voltage controlled oscillator 104 through an adder 112, the voltage controlled oscillator 104 continues to generate a specific oscillating frequency. An output frequency of the voltage controlled oscillator 104 is supplied to a phase comparator 102 through a variable divider 105. The phase comparator 102 compares an output of the variable divider 105 which frequency divides the oscillating frequency of the voltage controlled oscillator 104 according to a variable dividing ratio determined by a second controller 106 with the phase of a reference signal generated by a reference signal generator 101, and outputs a phase difference signal indicative of a comparison result. Since the phase difference signal includes many high frequency and noise components, a low-pass filter 103 converts the high frequency and noise components into a direct current (DC) component and supplies the DC component to a level detector 113. The level detector 113 detects whether or not the phase difference signal is within a specific range by comparing an analog signal outputted from the low-pass filter 103 with a predetermined reference level value, and supplies the detection result as a digital signal to a first controller 107. The first controller 107 checks whether or not the phase difference signal is within the specific range and checks which is the faster of two phases of the reference signal and the oscillating signal of the voltage controlled oscillator 104 by using the digital signal generated from the level detector 113. Further, the first controller 107 controls the phase difference between the reference signal and the oscillating signal of the voltage controlled oscillator 104 to be within the specific error range by increasing or decreasing the data stored in the first buffer 1100 according to the checked result. If the phase difference between the reference signal and the oscillating signal of the voltage controlled oscillator 104 is within the specific error range, the first controller 107 stores corresponding data of the first buffer 1100 in a second buffer 1090. Since the second buffer 1090 consists of a plurality of addresses corresponding to each frequency used in a system, data selected by the first controller 107 among the data of the first buffer 1100 can be stored in a corresponding address of the second buffer 1090. When there is a small number of frequencies used in the system, no problem occurs. However, when there are many frequencies used in the system, a calculator 114 may be efficiently used. That is, if there are a small number of frequencies, data corresponding to all the used frequencies may be stored in the second buffer 1090. However, if there are many frequencies, only the appropriate number of frequencies are evaluated and other frequencies are calculated using the calculator 114 to be stored in the corresponding address of the second buffer 1090. The data value corresponding to the used frequencies can be obtained through calculation because the control voltage characteristic of the voltage controlled oscillator 104 is close to linear.

If the transmitting/receiving operation is started, the data stored in the second buffer 1090 is converted into the analog data by the D/A converter 111 and added to a given offset voltage by the adder 112. Thus, the added result is used as the control voltage of the voltage controlled oscillator 104. At this point, the offset voltage is a DC voltage provided to correct the deviation generated in a circuit structure and facilitate the system.

Figure 11A:
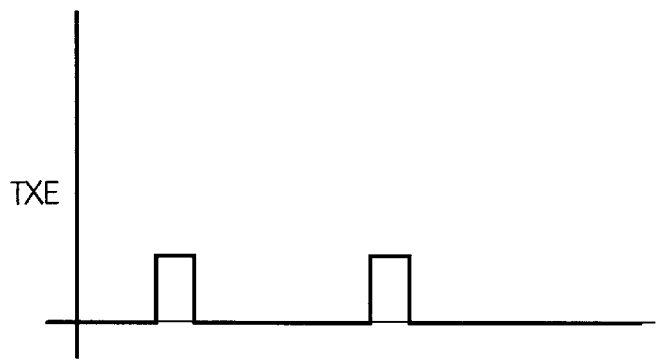
FIGS. 11A, 11B and 11C are graphic diagrams showing an operating time of a communication system of a frequency hopping type applied to the present invention and an operating time of the PLL according to the present invention.
Figure 11B:
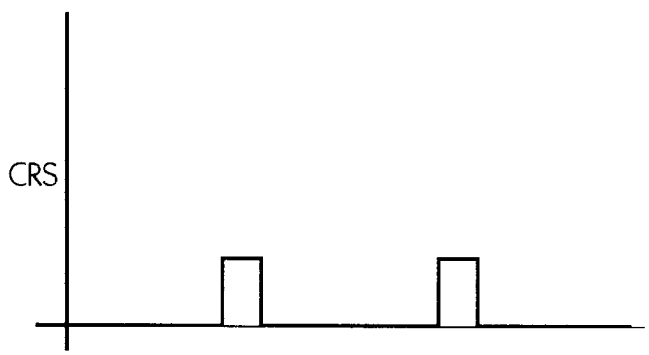
Figure 11C:
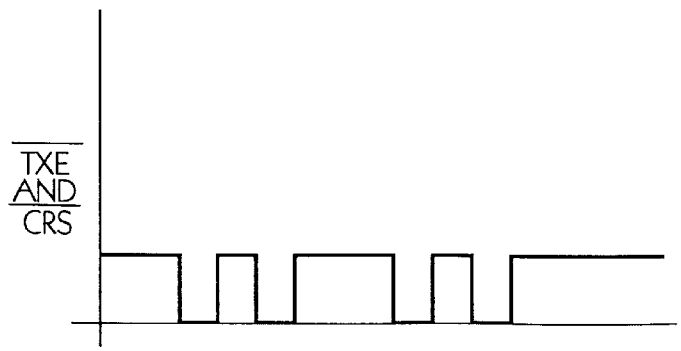

FIGS. 11A, 11B and 11C are graphic diagrams showing an operating time of a communication system of a frequency hopping type supplied to the present invention and an operating time of the PLL according to the present invention.

Referring to FIGS. 11A, 11B and 11C, there are shown timing diagrams of signals for controlling the operation of the communication system of the frequency hopping type, and the operating time of the PLL according to the present invention is determined by these signals. FIG. 11A illustrates a transmitter enable signal TXE for controlling the transmitting operation. Thus, when the transmitter enable signal TXE is in a logic "high" level, the system performs the transmitting operation. FIG. 11B illustrates a carrier sensing signal CRS for controlling the receiving operation. The carrier sensing signal CRS of a logic "high" level represents that a signal is being received. FIG. 11C shows a time the transmitting/receiving operation of the system is not implemented, that is, the time the transmitter enable signal TXE and the carrier sensing signal CRS are not generated. During this time, the PLL evaluates the control voltage for frequencies to be used in the system.

Figure 12A:
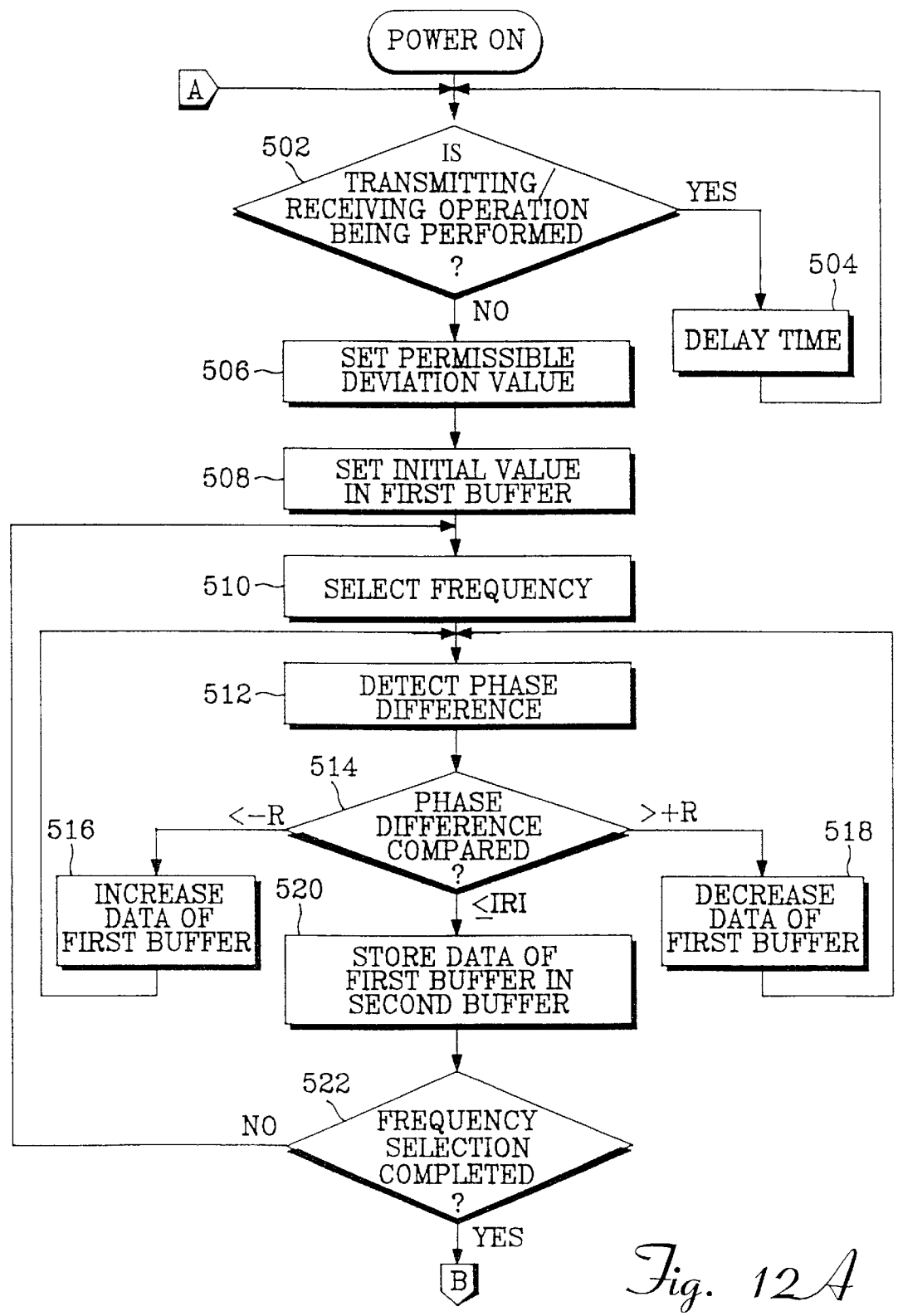
FIGS. 12A–12B together form a flowchart showing a write operation of the PLL according to the present invention.
Figure 12B:
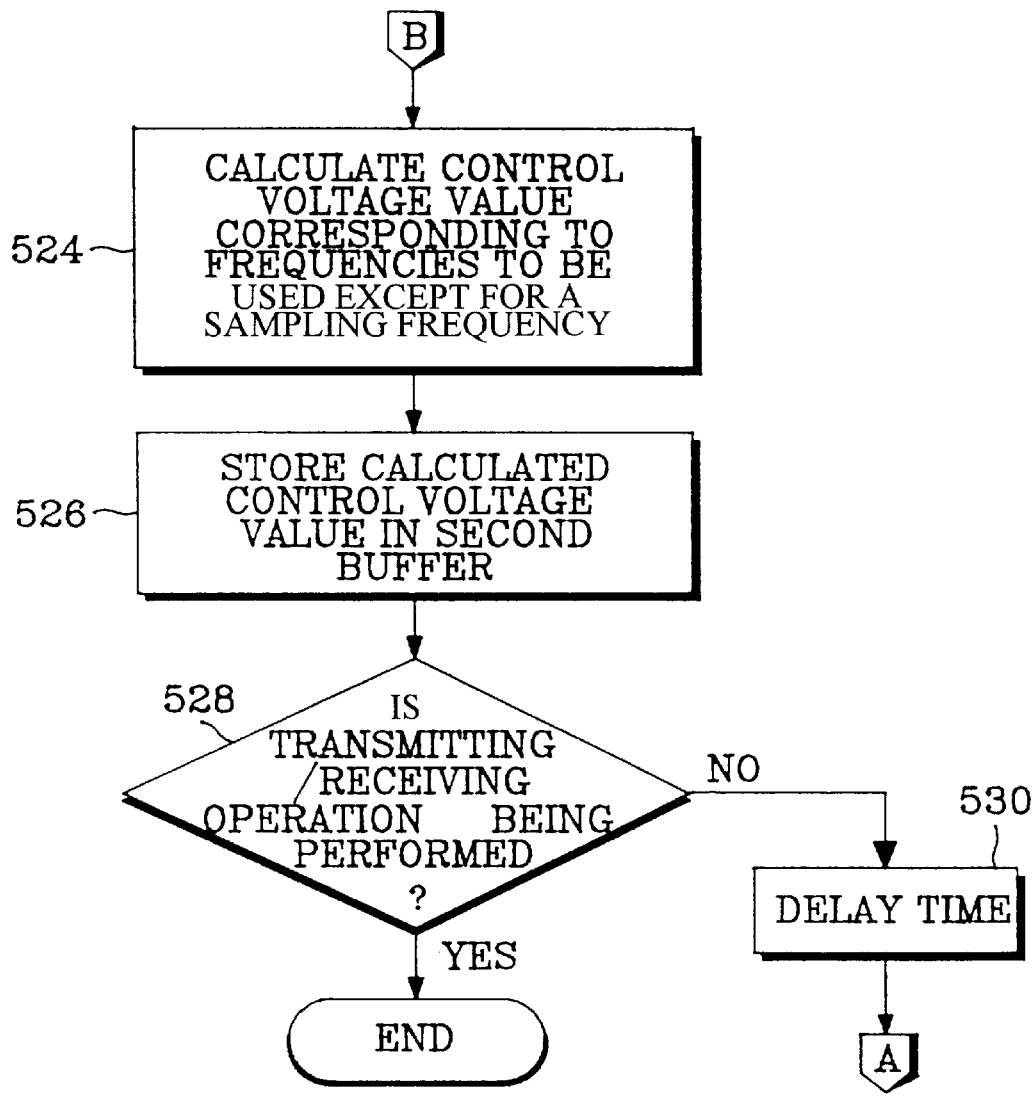

FIGS. 12A–12B together form a flowchart showing a write operation of the PLL according to the present invention. This write operation is implemented when the signal indicated in FIG. 4C is at a logic "high" level, that is, when the system does not perform any operation.

If the power is turned on, the first controller 107 checks, at step 502, whether or not the transmitting/receiving operation is being performed. If so, the first controller 107 delays a time at step 504 and returns to step 502. However, if not, that is, if the transmitting/receiving operation is not being performed, the first controller 107 sets a permissible deviation value R at step 506. The first controller 107 sets an initial value in the first buffer 1100 at step 508 and selects one of the used frequencies at step 510. Herein, to select one of the used frequencies means that the second controller 106 supplies the variable dividing ratio, corresponding to one frequency among the frequencies to be used in the system, to the variable divider 105. After the variable dividing ratio determined as above is supplied to the variable divider 105, the phase difference is detected at step 512 and a phase difference comparing operation is carried out at step 514. That is, the phase comparator 102 compares the phase of the output of the variable divider 105 with the phase of the output of the reference signal generator 101 and outputs the phase difference signal. The low-pass filter 103 low-pass filters the phase difference signal. The level detector 113 compares the level of the low-pass filtered phase difference signal with the level of the reference signal and generates the digital signal indicating the comparison result. The first controller 107 detects the phase difference between the currently selected frequency and the reference signal by using the digital signal and checks whether or not the phase difference is within the permissible deviation value R.

If the phase difference is less than the permissible deviation value R, the first controller 107 increases the data of the first buffer 1100 at step 516, and then repeats steps 512 and 514. On the contrary, if the phase difference is greater than the permissible deviation value R, the first controller 107 decreases the data of the first buffer 1100 and repeats steps 512 and 514. If the phase difference is within the permissible deviation value R, the first controller 107 stores the corresponding data of is the first buffer 1100 in the second buffer 1090. The above steps are repeated until the frequency selection to be evaluated is completed at step 522, that is, until the data corresponding to all of the frequencies to be used in the system is stored in the second buffer 1090. If the frequencies to be evaluated are all selected and the data of the first buffer 1100 is stored in the second buffer 1090, the control voltage value corresponding to the frequencies to be used except for a sampling frequency is calculated at step 524 and the calculated control voltage value is stored in the second buffer 1090 at step 526. In this case, the control voltage value is calculated by the calculator 114. At step 528, a determination is made as to whether or not the transmitting/receiving operation is being performed. If the transmitter enable signal TXE or the carrier sensing signal CRS which is a control signal indicating the transmitting/receiving operation is generated, the above processes are ended. If the control signal is not generated, the first controller 107 delays the given time at step 530 and returns to step 502.

On the other hand, in FIGS. 12A–12B, the write operation is ended when the control signal TXE or CRS indicating the transmitting/receiving operation is generated at step 528 after steps 502 to 526 are carried out. However, it may be preferable to end the write operation when the control signal TXE or CRS indicating the transmitting/receiving operation is generated even if any operation is performed.

Figure 13:
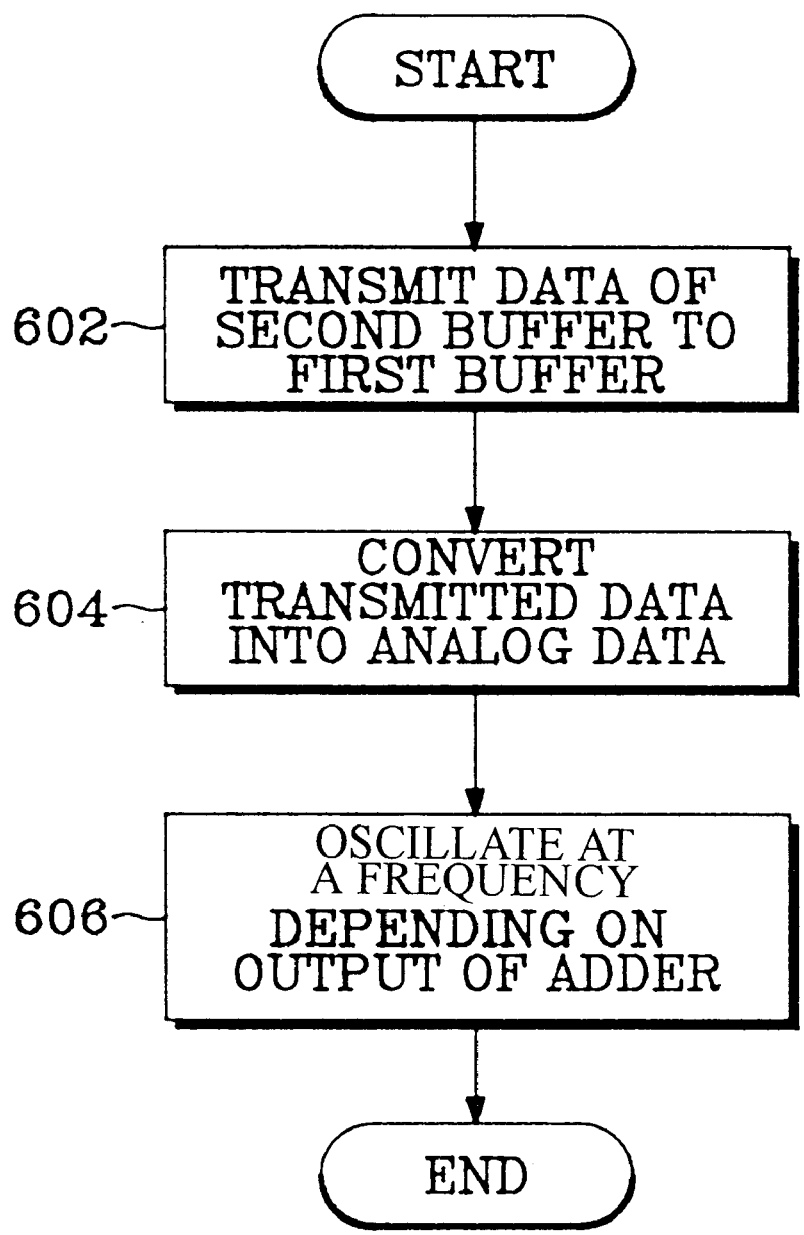
FIG. 13 is a flowchart showing a read operation of the PLL according to the present invention.

FIG. 13 is a flowchart showing a read operation of the PLL according to the present invention. This read operation is implemented when the transmitter enable signal TXE indicating the transmitting operation or the carrier sensing signal CRS indicating the receiving operation is generated.

If the transmitter enable signal TXE indicating the transmitting operation or the carrier sensing signal CRS indicating the receiving operation is generated, the first controller 107 transmits data corresponding to the control voltage value stored in the second buffer 1090 to the first buffer 1100 at step 602. The D/A converter 111 converts the data transmitted to the first buffer 1100 into an analog control voltage at step 604. The adder 112 adds the DC offset voltage to the analog control voltage and the added value is supplied to the voltage controlled oscillator 104. At step 606, the voltage controlled oscillator 104 oscillates at a frequency depending on the output of the adder 112.

Figure 14A:
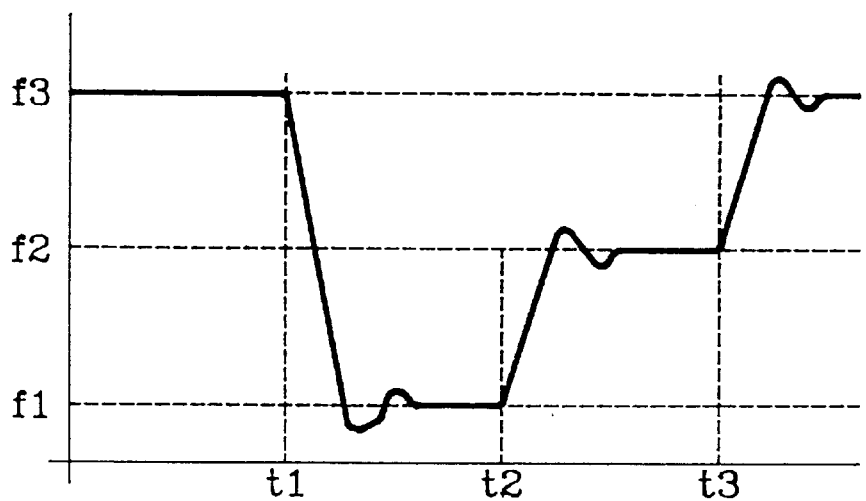
FIG. 14A is a graph showing the locking time characteristic of the PLL of FIG. 2.
Figure 14B:
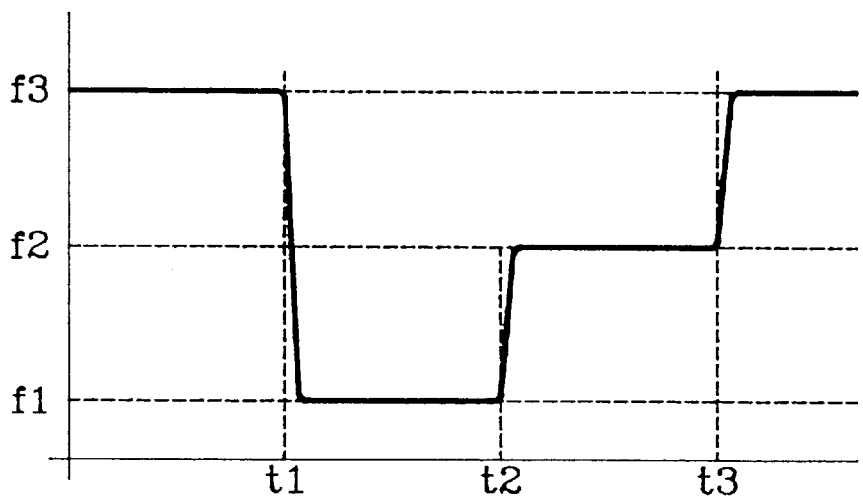
FIG. 14B is a graph showing the locking time characteristic of the PLL according to the present invention.

If the voltage controlled oscillator is controlled by the above described method, the locking time of the PLL of FIG. 2, as shown in FIG. 14A, can be greatly improved as shown in FIG. 14B.

As noted previously, the inventive PLL has a simplified construction and minimizes the component deviation of the voltage controlled oscillator and the frequency deviation caused by the variation of circumstances. Such a PLL is very useful in the communication system of the frequency hopping type, such as a wireless LAN, which requires a fast variation in the frequency.

While there have been shown and described what are considered to be preferred embodiments of the present invention, it will be apparent to those skilled in the art that various changes and modifications may be made therein without departing from the spirit of the invention. For example, it may be possible to use one storage unit instead of two buffers. Therefore, it should be understood that the present invention is not limited to the particular embodiments disclosed herein as the best mode contemplated for carrying out the present invention, but rather that the present invention is not limited to the specific embodiments described in this specification except as defined in the appended claims.

What is claimed is:

1. A phase locked loop of a radio communication system, comprising:

a storage unit for digitally storing a series of control voltages having different values;

a digital/analog converter for converting a read control voltage into an analog control voltage when any one of said series of control voltages stored in said storage unit is read;

a voltage controlled oscillator for oscillating at a frequency in accordance with a level of a supplied analog control voltage or an analog signal;

a variable divider for frequency dividing an output of said voltage controlled oscillator according to a variable dividing ratio determined by an operating mode of said radio communication system;

a phase comparator for comparing a phase of a signal outputted by said variable divider with that of an externally supplied reference signal, and for outputting a phase difference signal indicative of a comparison result;

a low-pass filter for low-pass filtering said phase difference signal;

a level detector for comparing a level of an analog signal outputted from said low-pass filter with a reference level, and for generating a comparison result as a digital signal;

a controller for reading any one of said series of control voltages stored in said storage unit by using said digital signal outputted from said level detector, and for performing a read operation until said digital signal outputted from said level detector is within a predetermined range; and a switch for supplying said analog control voltage outputted from said digital/analog converter to said voltage controlled oscillator by being electrically turned off under the control of said controller immediately before an operating mode of said radio communication system is implemented, and for supplying said analog signal outputted from said low-pass filter to said voltage controlled oscillator by being electrically turned on under the control of said controller when said radio communication system is in operation.

2. A phase locked loop as claimed in claim 1, said controller performing said read operation for said series of control voltages stored in said storage unit by electrically turning off said switch when said phase locked loop is turned on or when a receiving signal or a key input for signal transmission is sensed.

3. A phase locked loop as claimed in claim 2, said controller reading any one of said series of control voltages stored in said storage unit by using said digital signal outputted from said level detector even if there is no operation for a preset time during an operating mode of said radio communication system, and performing said read operation until said digital signal outputted from said level detector is within a predetermined range.

4. A phase locked loop as claimed in claim 1, said controller performing said read operation by increasing a control voltage value stored in said storage unit when a level of said digital signal outputted from said level detector is less than said predetermined range, and performing said read operation by decreasing said control voltage value stored in said storage unit when a level of said digital signal outputted from said level detector is greater than said predetermined range.

5. A phase locked loop as claimed in claim 4, said controller reading any one of said series of control voltages stored in said storage unit by using said digital signal outputted from said level detector even if there is no operation for a preset time during an operating mode of said radio communication system, and performing said read operation until said digital signal outputted from said level detector is within a predetermined range.

6. A phase locked loop as claimed in claim 1, said controller reading any one of said series of control voltages stored in said storage unit by using said digital signal outputted from said level detector even if there is no operation for a preset time during an operating mode of said radio communication system, and performing said read operation until said digital signal outputted from said level detector is within a predetermined range.

7. A phase locked loop of a radio communication system, comprising: a storage unit for digitally storing a series of control voltages having different values;

a digital/analog converter for converting a read control voltage into an analog control voltage when any one of said series of control voltages stored in said storage unit is read;

a voltage controlled oscillator for oscillating at a frequency in accordance with a level of a supplied analog control voltage or an analog signal;

a variable divider for frequency dividing an output of said voltage controlled oscillator according to a variable dividing ratio determined by an operating mode of said radio communication system;

a phase comparator for comparing a phase of a signal outputted by said variable divider with that of an externally supplied reference signal, and for outputting a phase difference signal indicative of a comparison result;

a low-pass filter for low-pass filtering said phase difference signal;

an analog/digital converter for converting said analog signal outputted from said low-pass filter into a digital signal;

a controller for reading any one of said series of control voltages stored in said storage unit by using said digital signal outputted from said analog/digital converter, and performing a read operation until said digital signal outputted from said analog-digital converter is within a predetermined range; and a switch for supplying said analog control voltage outputted from said digital/analog converter to said voltage controlled oscillator by being electrically turned off under the control of said controller immediately before an operating mode of said radio communication system is implemented, and for supplying said analog signal outputted from said low-pass filter to said voltage controlled oscillator by being electrically turned on under the control of said controller when said radio communication system is in operation.

8. A phase locked loop as claimed in claim 7, said controller performing said read operation for said series of control voltages stored in said storage unit by electrically turning off said switch when said phase locked loop is turned on or when a receiving signal or a key input for signal transmission is sensed.

9. A phase locked loop as claimed in claim 8, said controller reading any one of said series of control voltages stored in said storage unit by using said digital signal outputted from said analog/digital converter even if there is no operation for a preset time during an operating mode of said radio communication system, and performing said read operation until said digital signal outputted from said analog/digital converter is within a predetermined range.

10. A phase locked loop as claimed in claim 7, said controller performing said read operation by increasing a control voltage value stored in said storage unit when a level of said digital signal outputted from said analog/digital converter is less than said predetermined range, and performing said read operation by decreasing said control voltage value stored in said storage unit when a level of said digital signal outputted from said analog/digital converter is greater than said predetermined range.

11. A phase locked loop as claimed in claim 10, said controller reading any one of said series of control voltages stored in said storage unit by using said digital signal outputted from said analog/digital converter even if there is no operation for a preset time during an operating mode of said radio communication system, and performing said read operation until said digital signal outputted from said analog/digital converter is within a predetermined range.

12. A phase locked loop as claimed in claim 7, said controller reading any one of said series of control voltages stored in said storage unit by using said digital signal outputted from said analog/digital converter even if there is no operation for a preset time during an operating mode of said radio communication system, and performing said read operation until said digital signal outputted from said analog/digital converter is within a predetermined range.

13. A phase locked loop of a radio communication system, comprising:

a storage unit for digitally storing a series of control voltages having different values;

a digital/analog converter for converting a read control voltage into an analog control voltage when any one of said series of control voltages stored in said storage unit is read;

a voltage controlled oscillator for oscillating at a frequency in accordance with a level of a supplied analog control voltage or an analog signal;

a variable divider for frequency dividing an output of said voltage controlled oscillator according to a variable dividing ratio determined by an operating mode of said radio communication system;

a phase comparator for comparing a phase of a signal outputted from said variable divider with that of an externally supplied reference signal, and for outputting a phase difference signal indicating a comparison result;

a low-pass filter for low-pass filtering said phase difference signal;

a phase error comparator for detecting a phase error value between a signal outputted from said variable divider and said reference signal by using said phase difference signal;

a controller for reading any one of said series of control voltages stored in said storage unit by using a digital signal outputted from said phase error comparator and for performing a read operation until said digital signal is within a predetermined range; and a switch for supplying said analog control voltage outputted from said digital/analog converter to said voltage controlled oscillator by being electrically turned off under the control of said controller immediately before an operating mode of said radio communication system is implemented, and for supplying said analog signal outputted from said low-pass filter to said voltage controlled oscillator by being electrically turned on under the control of said controller when said radio communication system is in operation.

14. A phase locked loop as claimed in claim 13, said controller performing said read operation for said series of control voltages stored in said storage unit by electrically turning off said switch when said phase locked loop is turned on or when a receiving signal or a key input for signal transmission is sensed.

15. A phase locked loop as claimed in claim 14, said controller reading any one of said series of control voltages stored in said storage unit by using said phase error value outputted from said phase error comparator even if there is no operation for a preset time during an operating mode of said radio communication system, and performing said read operation until said phase error value outputted from said phase error comparator is within a predetermined range.

16. A phase locked loop as claimed in claim 13, said controller performing said read operation by increasing a control voltage value stored in said storage unit when a level of said digital signal outputted from said phase error comparator is less than said predetermined range, and performing said read operation by decreasing said control voltage value stored in said storage unit when a level of said digital signal outputted from said phase error comparator is greater than said predetermined range.

17. A phase locked loop as claimed in claim 16, said controller reading any one of said series of control voltages stored in said storage unit by using said phase error value outputted from said phase error comparator even if there is no operation for a preset time during an operating mode of said radio communication system, and performing said read operation until said phase error value outputted from said phase error comparator is within a predetermined range.

18. A phase locked loop as claimed in claim 13, said controller reading any one of said series of control voltages stored in said storage unit by using said phase error value outputted from said phase error comparator even if there is no operation for a preset time during an operating mode of said radio communication system, and performing said read operation until said phase error value outputted from said phase error comparator is within a predetermined range.

19. A phase locked loop for a communication system, comprising:

a buffer for digitally storing a series of control voltages;

a digital/analog converter for converting an supplied digital control voltage into an analog control voltage;

a voltage controlled oscillator for oscillating at a frequency depending on said analog control voltage outputted from said digital/analog converter;

a variable divider for frequency dividing an output of said voltage controlled oscillator according to a variable dividing ratio;

a phase comparator for comparing a phase of a signal generated by said variable divider with that of a reference signal, and for generating a phase difference signal indicative of a comparison result;

a low-pass filter for low-pass filtering said phase difference signal;

a level detector for comparing a level of an analog signal generated by said low-pass filter with a reference level, and for generating a digital signal indicative of a comparison result; and a controller for selectively storing the control voltage related to a frequency to be used by varying and reading said series of control voltages stored in said buffer so as to be supplied to said digital/analog converter until said digital signal is within a preset range when a transmitting/receiving operation is not being performed, and for supplying said stored control voltage to said digital/analog converter when the transmitting/receiving operation is being performed.

20. A phase locked loop as claimed in claim 19, said controller performing a read operation by increasing said control voltage value stored in said buffer when a level of said digital signal generated by said level detector is less than said preset range, and performing the read operation by decreasing said control voltage value stored in said buffer when the level of said digital signal generated by said level detector is greater than said preset range.

21. A phase locked loop for a communication system, comprising:

a first buffer for digitally storing a series of control voltages;

a second buffer connected to said first buffer;

a digital/analog converter for converting an supplied digital control voltage into an analog control voltage;

an adder for adding an output of said digital/analog converter to a given offset voltage;

a voltage controlled oscillator for oscillating at a frequency depending on said analog control voltage generated by said adder;

a variable divider for frequency dividing an output of said voltage controlled oscillator according to a variable dividing ratio;

a phase comparator for comparing a phase of a signal generated by said variable divider with that of a reference signal, and for outputting a phase difference signal indicative of a comparison result;

a low-pass filter for low-pass filtering said phase difference signal;

a level detector for comparing a level of an analog signal generated by said low-pass filter with a reference level, and for outputting a digital signal indicative of a comparison result; and a controller for storing a corresponding control voltage related to a frequency to be used in said second buffer when said digital signal is within a preset range while varying and reading said series of control voltages stored in said first buffer so as to be supplied to said digital/analog converter when a transmitting/receiving operation is not being performed, and supplying said control voltage stored in said second buffer to said digital/analog converter when the transmitting/receiving operation is being performed.

22. A phase locked loop as claimed in claim 21, said controller performing a read operation by increasing said control voltage value stored in said first buffer when a level of said digital signal generated by said level detector is less than said preset range, and performing the read operation by decreasing said control voltage value stored in said first buffer when the level of said digital signal generated by said level detector is greater than said preset range.

23. A phase locked loop for a communication system, comprising:

a digital/analog converter for converting an supplied digital control voltage into an analog control voltage;

a voltage controlled oscillator for oscillating at a frequency depending on said analog control voltage outputted from said digital/analog converter;

a variable divider for frequency dividing an output of said voltage controlled oscillator according to a variable dividing ratio;

a phase comparator for comparing a phase of a signal generated by said variable divider with that of a reference signal, and for generating a phase difference signal indicative of a comparison result;

a low-pass filter for low-pass filtering said phase difference signal;

a level detector for comparing a level of an analog signal generated by said low-pass filter with a reference level, and for generating a digital signal indicative of a comparison result;

a controller for evaluating a corresponding control voltage as a control voltage to be used when said digital signal is within a preset range while varying a series of control voltages to be supplied to said digital/analog converter when a transmitting/receiving operation is not being performed and for supplying said evaluated control voltage to said digital/analog converter when the transmitting/receiving operation is being performed.

24. A phase locked loop as claimed in claim 23, said controller evaluating said control voltage by increasing a corresponding control voltage value when a level of said digital signal generated by said level detector is less than said preset range, and evaluating the control voltage by decreasing said corresponding control voltage value when the level of said digital signal generated by said level detector is greater than said preset range.

25. A phase locked loop as claimed in claim 23, further comprising:

an adder connected between said digital/analog converter and said voltage controlled oscillator, for adding an output of said digital/analog converter to a given offset voltage and for supplying an added result to said voltage controlled oscillator.

* * * * *